(12) United States Patent
Li

(10) Patent No.: US 12,405,853 B2
(45) Date of Patent: Sep. 2, 2025

(54) DATA STORAGE DEVICE AND SEARCHING METHOD FOR READING VOLTAGE THEREOF

(71) Applicant: Silicon Motion, Inc., Jhubei (TW)

(72) Inventor: Fahao Li, Shenzhen (CN)

(73) Assignee: Silicon Motion, Inc., Jhubei (TW)

( * ) Notice: Subject to any disclaimer, the term of this patent is extended or adjusted under 35 U.S.C. 154(b) by 0 days.

(21) Appl. No.: 18/628,831

(22) Filed: Apr. 8, 2024

(65) Prior Publication Data

US 2024/0345918 A1  Oct. 17, 2024

(30) Foreign Application Priority Data

Apr. 14, 2023  (CN) .......................... 202310402077.0

(51) Int. Cl.
| G06F 11/10 | (2006.01) |
| G11C 16/34 | (2006.01) |
| G11C 29/42 | (2006.01) |

(52) U.S. Cl.
CPC ...... *G06F 11/1016* (2013.01); *G06F 11/1048* (2013.01); *G06F 11/1068* (2013.01); *G11C 16/3404* (2013.01); *G11C 29/42* (2013.01)

(58) Field of Classification Search
CPC ............ G06F 11/1016; G06F 11/1048; G06F 11/1068; G11C 16/3404; G11C 29/42
USPC ................ 714/764, 718, 719, 768, 769, 773
See application file for complete search history.

(56) References Cited

U.S. PATENT DOCUMENTS

| 10,910,061 | B2 | 2/2021 | Tran et al. | |
| 12,260,123 | B1* | 3/2025 | Li | G06F 3/0619 |
| 2014/0269050 | A1* | 9/2014 | Lasser | G11C 29/42 |
| | | | | 365/185.02 |
| 2014/0359202 | A1* | 12/2014 | Sun | G11C 7/14 |
| | | | | 365/185.11 |
| 2017/0109040 | A1* | 4/2017 | Raghu | G06F 3/061 |
| 2024/0345918 | A1* | 10/2024 | Li | G06F 11/1048 |

FOREIGN PATENT DOCUMENTS

| CN | 103985415 | A | 8/2014 |
| CN | 113096711 | A | 7/2021 |
| CN | 113672178 | B | 3/2022 |
| CN | 115691625 | A | 2/2023 |
| CN | 111200440 | B | 4/2023 |
| TW | 1707231 | B | 10/2020 |

* cited by examiner

*Primary Examiner* — John J Tabone, Jr.

(57) ABSTRACT

A method of searching for read voltages includes: respectively reading a memory segment through read voltages to obtain a sampling data, wherein the read voltages are composed of pairs of adjacent read voltages, and the memory segment is from a non-volatile flash memory; counting the number of first bits in each sampling data, wherein the numbers of first bits correspond to the read voltages respectively; obtaining number differences of the first bits corresponding to the pairs of adjacent read voltages; calculating a coefficient matrix according to the read voltages and the differences of the number of first bits; calculating fitting values according to the read voltages and the coefficient matrix, wherein the fitting value corresponds to the read voltage respectively; and selecting a read voltage corresponding to a minimum value among the fitting values to read the memory segment to perform an error correction program.

16 Claims, 2 Drawing Sheets

DATA STORAGE DEVICE AND SEARCHING METHOD FOR READING VOLTAGE THEREOF

FIELD OF THE INVENTION

The present invention relates to data reading techniques, and more particularly, to a data storage device and a method of searching for read voltages (also referred to as reading voltages).

BACKGROUND OF THE INVENTION

When a storage device is left unused for a long time or when its life span had decreased, the voltage drifting effect may appear on the storage device, resulting in increased error rate and poor data stability. When reading the data storage device with the preset read voltage of the original memory manufacturer, if the voltage drifting is too large, there will be too many flip bits being read, exceeding the decoding and error correction ability of the error correction unit (e.g., an LDPC decoding unit) on the main control terminal or the data storage device, and data will be lost. In order to solve the serious voltage drift phenomenon occurred in the data storage device, if errors occurred when reading with a present read voltage and the errors cannot be corrected, a conventional way is to read the data in the data storage device with a reread voltage. To process may require the attempt of using multiple reread voltages to succeed, and if this step fails, the process enters the next stage. The success rate of decoding can be increased by repeatedly adjusting the reread voltage. If the reread still fails after multiple attempts, it means that the current present reread voltage cannot correct the bit inversion error caused by the voltage drift. As a result, the process will enter a next stage to find the optimal read voltage via setting a read voltage different from that of the OEM setting. The optimal read voltage can be used to read non-volatile memories, and cooperate with the soft decision algorithm of LPDC to perform decoding.

SUMMARY OF THE INVENTION

The present invention provides a data storage device for searching for the optimal read voltage using a linear regression model and a method thereof, which can solve the problem of searching the false optimal voltage due to data instability in the process of searching for the optimal read voltage, thus improving the searching accuracy and the success rate of subsequent soft decoding.

The present invention provides a method of searching for read voltages of a data storage device. The data storage device comprises a calculation circuit and a non-volatile flash memory, and the method is executed by the calculation circuit to perform following steps: reading a memory segment through a plurality of read voltages to obtain a plurality of sampling data respectively, wherein the read voltages are composed of pairs of adjacent read voltages, and the memory segment is from the non-volatile flash memory; counting first bits in each of the sampled data to obtain a first bit number, wherein the first bit numbers correspond to the read voltages respectively; obtaining a number difference from the first bit numbers of each of the pairs of adjacent read voltages; calculating a coefficient matrix according to the read voltages and the number differences; calculating a plurality of fitting values according to the read voltages and the coefficient matrix, wherein the fitting values correspond to the read voltages respectively; and selecting a read voltage among the read voltages corresponding to a minimum fitting value among the fitting values, in order to read the memory segment to perform an error correction program.

The prevent invention provides a data storage device comprising a non-volatile flash memory and a calculation circuit coupled to the non-volatile flash memory. The calculation circuit executes a method of searching for read voltages that comprises following steps: reading a memory segment through a plurality of read voltages to obtain a plurality of sampling data respectively, wherein the read voltages are composed of pairs of adjacent read voltages, and the memory segment is from the non-volatile flash memory; counting first bits in each of the sampled data to obtain a first bit number, wherein the first bit numbers correspond to the read voltages respectively; obtaining a number difference from the first bit number of each of the pairs of adjacent read voltages; calculating a coefficient matrix according to the read voltages and the number differences; calculating a plurality of fitting values according to the read voltages and the coefficient matrix, wherein the fitting values correspond to the read voltages respectively; and selecting a read voltage among the read voltages corresponding to a minimum fitting value among the fitting values, in order to read the memory segment to perform an error correction program.

In one embodiment of the present invention, the read voltages are stored in a read voltage list.

In one embodiment of the present invention, each of the first bits is bit 1 or bit 0.

In an embodiment of the present invention, the memory segment is a page, block or chunk.

In an embodiment of the present invention, the coefficient matrix is a linear regression coefficient matrix represented by $A=(X^TX)^{-1}X^TY$, where X denotes a voltage vector composed of the read voltages, and Y denotes a difference vector composed of the number differences.

The present invention also provides a data storage device that comprises a non-volatile flash memory and a calculation circuit coupled to the non-volatile flash memory. The calculation circuit executes a method of searching for read voltages executed to perform following steps: reading a memory segment through a plurality of read voltages to obtain a plurality of sampling data respectively, wherein the read voltages are composed of pairs of adjacent read voltages, and the memory segment is from the non-volatile flash memory; counting first bits in each of the sampled data to obtain a first bit number, wherein each of the first bit numbers corresponds to the read voltages respectively; obtaining a number difference from the first bit numbers of each pair of adjacent read voltages; calculating a coefficient matrix according to the read voltages and the number differences; calculating a plurality of fitting values according to the read voltages and the coefficient matrix, wherein the fitting values correspond to the read voltages; and selecting a read voltage among the read voltages corresponding to a minimum fitting value among the fitting values, in order to read the memory segment to perform an error correction program.

In an embodiment of the present invention, the searching method further comprises: calculating a fitting vector according to the voltage vector and the coefficient matrix, wherein the fitting vector comprises a plurality of fitting values corresponding to the read voltages.

In one embodiment of the present invention, the first read voltage corresponds to a minimum value in the fitting vector.

In one embodiment of the present invention, the coefficient matrix is a linear regression coefficient matrix represented by $A=(X^TX)^{-1}X^TY$.

In one embodiment of the present invention, the first bit is bit 1 or bit 0.

In an embodiment of the present invention, the memory segment is a page, block or a chunk.

In one embodiment of the present invention, the error correction program is a soft decoding program of a low-density parity-check (LDPC) code.

Because the linear regression model is adopted to search for the optimal read voltage, the present invention can solve the problem of searching for the wrong optimal voltage due to data instability in the process of searching for the optimal read voltage, improve the searching accuracy and improve the success rate of subsequent soft decoding.

In order to make the above and other objects, features and advantages of the present invention more obvious and easier to understand, the following examples are given in detail with the accompanying drawings.

DETAILED DESCRIPTION OF PREFERRED EMBODIMENTS

In order to make the purpose, technical scheme and advantages of the present invention easier to understand, the present invention is further described in details with the accompanying drawings and examples. It should be noted that specific embodiments described herein are only used for illustrative purposes, and are not meant to limit the scope of the present invention. Various modifications made by one skilled in the art based on the embodiments provided in the present invention without creative efforts shall belong to the scope of the present invention.

Furthermore, it should be noted that in the embodiment of the present invention, the term "couple" provided herein encompasses direct electrical connection as well as indirect electrical connection via other elements, modules or devices. For brevity, the concept will not be further repeated in the following context.

Figure 1:
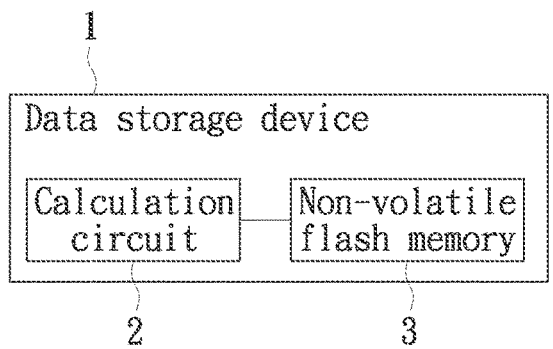
FIG. 1 is a block diagram of a data storage device according to an embodiment of the present invention.

Please refer to FIG. 1, which is a block diagram of a data storage device according to an embodiment of the present invention. The data storage device 1 provided in this embodiment includes a calculation circuit 2 and a non-volatile flash memory 3, wherein the calculation circuit 2 is coupled to the non-volatile flash memory 3.

According to an embodiment of the present invention, the data storage device 1 may be a flash memory such as a memory card, a universal serial USB flash device, a solid-state hard disk (SSD), an embedded flash memory module (eMMC), etc., which adopts a USB, SATA, PATA or PCI physical interface, or adopts a USB, NVME, AHCI or SCSI communication protocol.

According to an embodiment of the present invention, the calculation circuit 2 which may include but is not limited to a controller, a processor, a microprocessor, etc. is used to perform writing, reading, erasing and programming of the non-volatile flash memory 3 according to a command from a master terminal (e.g., a host computer), and to automatically perform the method of searching for the read voltages of the data storage device 1 provided by the embodiment of the present invention.

According to an embodiment of the present invention, the non-volatile flash memory 3 may be a NAND flash memory, such as SLC, MLC, TLC, QLC, etc.

Figure 2:
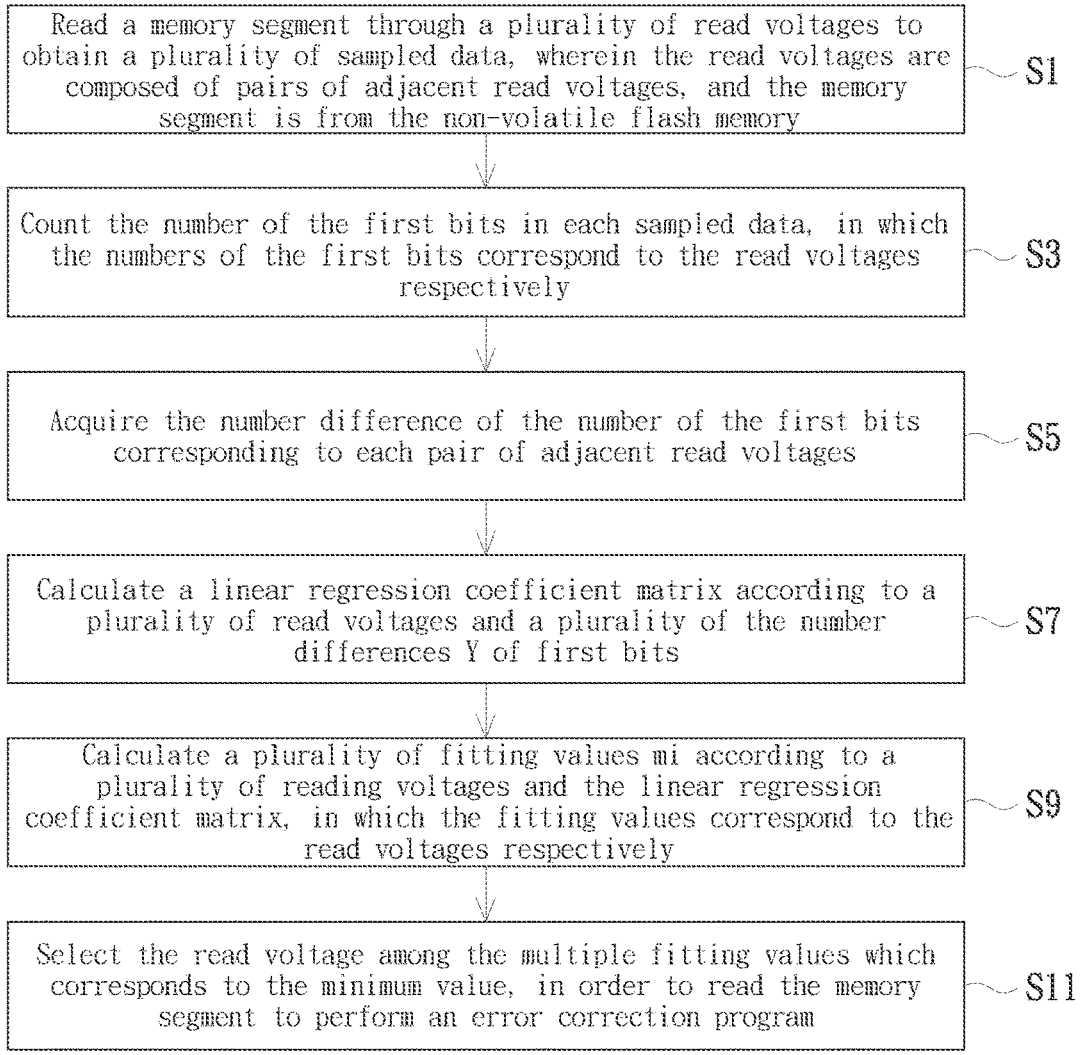
FIG. 2 is a flowchart of a method of searching for a read voltage according to an embodiment of the present invention.

Please refer to FIG. 2, which is a flowchart of a method of searching for the read voltages according to an embodiment of the present invention. The method of searching for the read voltages provided in this embodiment comprises the following steps. Step S1: Read a memory segment through a plurality of read voltages $X=(x_1, x_2, \ldots, x_n)$ to obtain a plurality of sampled data, wherein the read voltages X are composed of pairs of adjacent read voltages, and the memory segment is from the non-volatile flash memory 3. A plurality of read voltages X are stored in a read voltage list which may include but is not limited to: a voltage section, a plurality of voltage sections or the whole read voltage list. The read voltage list can be stored in a volatile memory located in the data storage device 1 or the calculation circuit 2. Further, the read voltage list can also be stored in the non-volatile flash memory 3. The present invention does not limit the location storing the read voltage list. The memory segment may be a page, a block, a chunk in the non-volatile flash memory 3.

Step S3: Count the number of the first bits in each sampled data. According to an embodiment of the present invention, the first bit is bit 1, and the calculation circuit 2 counts the number of bits with the value being 1 in each sampled data. The number of bits with the value being 1 in each sampled data corresponds to a corresponding read voltage. According to another embodiment of the present invention, the first bit is bit 0, and the calculation circuit 2 counts the number of bit with the value being 0 in each sampling data, and the number of bit 0 in each sampling data corresponds to a corresponding read voltage. The table below is an example of the above embodiments.

| Read voltage X | $x_1$ | $x_2$ | $x_3$ | $x_4$ | $x_5$ | ... | $x_n$ |
|---|---|---|---|---|---|---|---|
| Number of first bits | 300 | 700 | 900 | 600 | 400 | ... | 1000 |

S5: Acquire the number difference of the number of the first bits corresponding to each pair of adjacent read voltages. Specifically, the calculation circuit 2 calculates the difference Y according to the number of the first bits corresponding to each two read voltages X. After calculating the number difference being 400 according to the number of the first bits 700 of the read voltage $x_2$ and the number of the first bits being of the read voltage $x_1$, the calculation circuit 2 makes the number difference of 400 correspond to the read voltage $x_1$. Similarly, after calculating the number difference between the number of the first bits of the read voltage $x_3$ which is 900 and the number of the first bits of the read voltage $x_2$ which is 700, the calculation circuit 2 makes the number difference of 200 correspond to the read voltage $x_2$. As to how to calculate the rest of read voltages and the number differences Y can be realized from the above example, further illustrations are omitted here for brevity.

| Read voltage X | x1 | x2 | x3 | x4 | x5 | ... |
|---|---|---|---|---|---|---|
| Number difference Y of the first bits | 400 | 200 | −300 | −200 | −100 | ... |

S7: Calculate a linear regression coefficient matrix A according to a plurality of read voltages X and a plurality of the number differences Y of first bits. Specifically, the calculation circuit 2 substitutes the plurality of read voltages X and the plurality of number differences Y into the linear regression coefficient matrix equation $A=(X^TX)^{-1}X^TY$, so as to solve the linear regression coefficient matrix equation A (e.g., $(a_1, a_2, \ldots, a_n)$), where X (e.g., $(x_1, x_2, \ldots, x_n)$) represents a plurality of read voltages, and Y (e.g., $(y_1, y_2, \ldots, y_n)$) represents a plurality of first bits.

Step S9: Calculate, based on a linear regression model M, a plurality of fitting values mi according to a plurality of reading voltages X and the linear regression coefficient matrix A. Specifically, the calculation circuit 2 substitutes a plurality of read voltages X (e.g., $(x_1, x_2, \ldots, x_n)$) and a linear regression coefficient matrix A (e.g., $(a_1, a_2, \ldots, a_n)$) into a linear regression model M ($m_i=a_1x_i+a_2x_i+\ldots+a_nx_i$) to obtain a plurality of fitting values $(m_1, m_2, \ldots, m_n)$, where i=1~n. Each of the fitting values corresponds to a corresponding read voltage in a one-to-one manner. The table below is an example for reference.

| Read voltage X | $x_1$ | $x_2$ | $x_3$ | $x_4$ | $x_5$ | ... |
|---|---|---|---|---|---|---|
| Fitting values $(m_1, m_2, \ldots, m_n)$ | 895 | 550 | 100 | 455 | 764 | ... |

Step S11: Select the read voltage among the multiple fitting values which corresponds to the minimum value, in order to read the memory segment to perform an error correction program. Specifically, after obtaining the fitting values M, the calculation circuit 2 will search for the minimum value Mmin among the fitting values M. In the above embodiment, 100 is the minimum value, and the read voltage $x_3$ corresponding to the minimum value 100 is the optimal read voltage. The calculation circuit 2 selects the read voltage $x_3$ to read the memory segment, and executes the soft decoding program in the low-density parity check code (LDPC).

Figure 3:
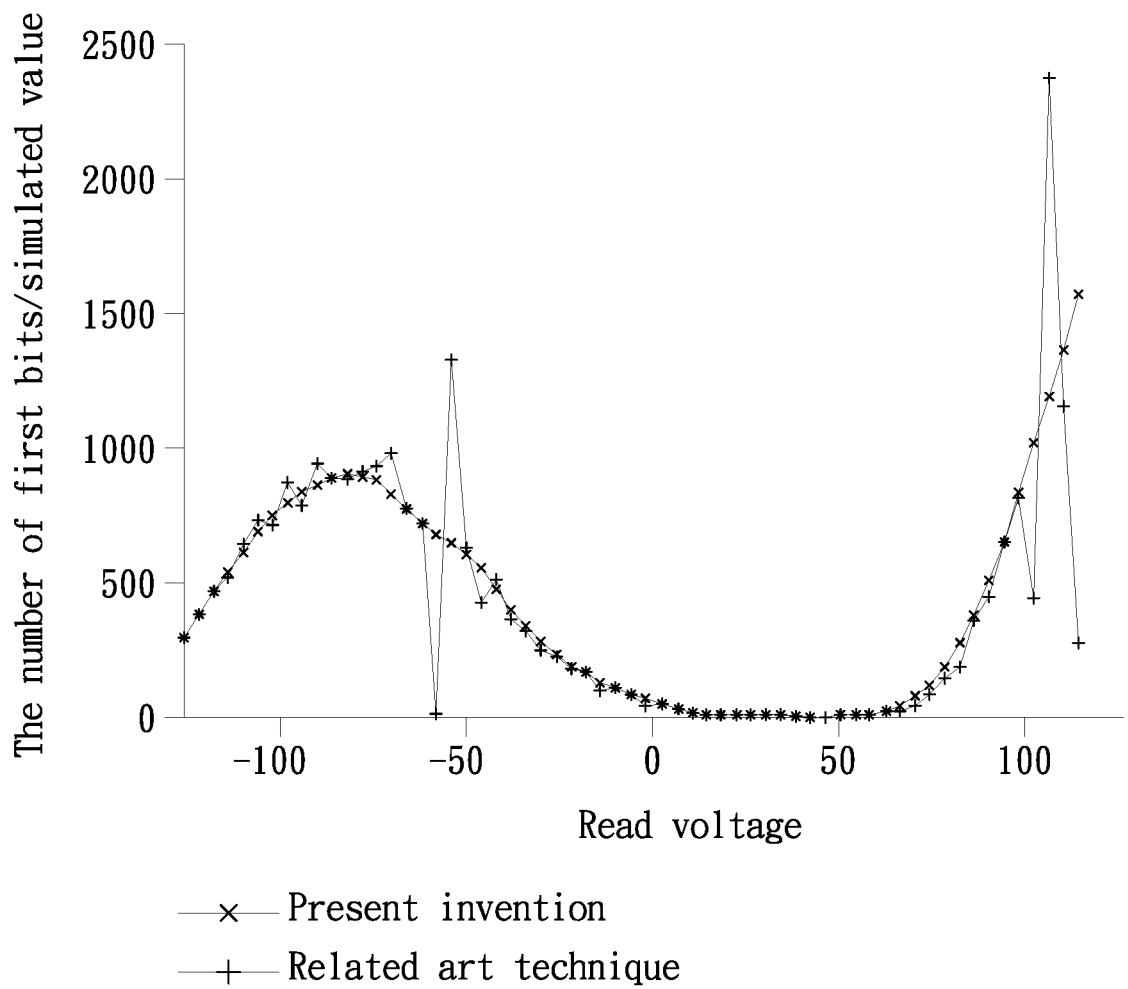
FIG. 3 is a comparison diagram between a method of searching for read voltages provided by an embodiment of the present invention and a conventional searching method.

Please refer to FIG. 3, which is a comparison diagram between a method of searching for read voltages provided by an embodiment of the present invention and a conventional searching method. It can be seen from the above comparison diagram that in the conventional searching method, the numbers of the first bits have some relatively low points between −50 and −100, and there are also many relatively low points around the read voltage of 100, thereby making the conventional searching method misjudge the read voltage as about −60. Meanwhile, in the method of searching read voltages provided by the embodiments of the present invention, the number of the first bits is processed using the linear regression model, so that the curve is smoother and does not generate multiple relatively low points that lead to misjudgment of the read voltages. With the solutions provided by the present invention, the reading voltage corresponding to the lowest point of the fitting value M can be precisely found at about 50, which is taken as the optimal reading voltage.

To sum up, with the linear regression model which is capable of searching for the optimal read voltage, the data storage device and the method of searching for the read voltages provided by the embodiments of the present invention may solve the problem of obtaining for the false optimal voltages due to the data instability in the process of searching for the optimal read voltage, raise the searching accuracy, and improve the success rate of subsequent soft decoding.

Although the aforementioned embodiments have been provided, those embodiments are merely for illustrative purposes and are not meant to limit the scope of the present invention. As those skilled in the art may make changes or modifications without departing from the spirit and scope of the present invention, the actual scope of the present invention should be determined by the claims.

What is claimed is:

1. A method of searching for read voltages of a data storage device, wherein the data storage device comprises a calculation circuit and a non-volatile flash memory, and the method is executed by the calculation circuit to perform following steps:
    reading a memory segment through a plurality of read voltages to obtain a plurality of sampling data respectively, wherein the read voltages are composed of pairs of adjacent read voltages, and the memory segment is from the non-volatile flash memory;
    counting first bits in each of the sampled data to obtain a first bit number, wherein the first bit numbers correspond to the read voltages respectively;
    obtaining a number difference from the first bit numbers of each of the pairs of adjacent read voltages;
    calculating a coefficient matrix according to the read voltages and the number differences;
    calculating a plurality of fitting values according to the read voltages and the coefficient matrix, wherein the fitting values correspond to the read voltages respectively; and
    selecting a read voltage among the read voltages corresponding to a minimum fitting value among the fitting values, in order to read the memory segment to perform an error correction program.

2. The method according to claim 1, wherein the read voltages are stored in a read voltage list.

3. The method according to claim 1, wherein each of the first bits is bit 1 or bit 0.

4. The method according to claim 1, wherein the memory segment is a page, block or chunk.

5. The method according to claim 1, wherein the coefficient matrix is a linear regression coefficient matrix represented by $A=(X^TX)^{-1}X^TY$, where X denotes a voltage vector composed of the read voltages, and Y denotes a difference vector composed of the number differences.

6. A data storage device, comprising:
    a non-volatile flash memory; and
    a calculation circuit coupled to the non-volatile flash memory;
    wherein the calculation circuit executes a method of searching for read voltages that comprises following steps:
    reading a memory segment through a plurality of read voltages to obtain a plurality of sampling data respectively, wherein the read voltages are composed of pairs of adjacent read voltages, and the memory segment is from the non-volatile flash memory;
    counting first bits in each of the sampled data to obtain a first bit number, wherein the first bit numbers correspond to the read voltages respectively;

obtaining a number difference from the first bit number of each of the pairs of adjacent read voltages;

calculating a coefficient matrix according to the read voltages and the number differences;

calculating a plurality of fitting values according to the read voltages and the coefficient matrix, wherein the fitting values correspond to the read voltages respectively; and selecting a read voltage among the read voltages corresponding to a minimum fitting value among the fitting values, in order to read the memory segment to perform an error correction program.

7. The data storage device of claim 6, wherein the first bit is bit 1 or bit 0.

8. The data storage device according to claim 6, wherein the memory segment is a page, block or chunk.

9. The data storage device as claimed in claim 6, wherein the coefficient matrix is a linear regression coefficient matrix represented by $A=(X^TX)^{-1}X^TY$, where X denotes a voltage vector composed of the read voltages, and Y denotes a difference vector composed of the number differences.

10. A method of searching for read voltages, comprising:

reading a memory segment according to a plurality of read voltages in a voltage vector to obtain a number of a plurality of first bits respectively, wherein the first bit number correspond to the read voltages respectively;

acquiring a number difference of the numbers of first bits corresponding to each pair of adjacent read voltages, wherein the number differences form a difference vector;

calculating a coefficient matrix according to the voltage vector and the difference vector;

calculating a first read voltage according to the voltage vector and the coefficient matrix; and reading the memory segment with the first read voltage to perform an error correction program.

11. The searching method according to claim 10, further comprising:

calculating a fitting vector according to the voltage vector and the coefficient matrix, wherein the fitting vector comprises a plurality of fitting values corresponding to the read voltages.

12. The searching method according to claim 11, wherein the first read voltage corresponds to a minimum value in the fitting vector.

13. The searching method according to claim 10, wherein the coefficient matrix is a linear regression coefficient matrix represented by $A=(X^TX)^{-1}X^TY$, where X denotes the voltage vector and Y denotes the difference vector.

14. The searching method according to claim 10, wherein the first bit is bit 1 or bit 0.

15. The searching method according to claim 10, wherein the memory segment is a page, block or a chunk.

16. The searching method according to claim 10, wherein the error correction program is a soft decoding program of a low-density parity-check (LDPC) code.

* * * * *